(12) United States Patent
Hougham et al.

(10) Patent No.: US 6,881,366 B2
(45) Date of Patent: Apr. 19, 2005

(54) PROCESS OF FABRICATING A PRECISION MICROCONTACT PRINTING STAMP

(75) Inventors: Gareth Hougham, Ossining, NY (US); Peter Fryer, Yorktown Heights, NY (US); Ronald Nunes, Hopewell Junction, NY (US); Mary Beth Rothwell, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 10/127,375

(22) Filed: Apr. 22, 2002

(65) Prior Publication Data

US 2004/0150129 A1 Aug. 5, 2004

(51) Int. Cl.[7] .......................... B29C 31/04; B29C 39/24
(52) U.S. Cl. .......................... 264/85; 264/102; 264/319
(58) Field of Search .......................... 264/1.1, 496, 319, 264/85, 101, 102

(56) References Cited

U.S. PATENT DOCUMENTS 5,435,943 A * 7/1995 Adams et al. ............... 264/1.1

OTHER PUBLICATIONS

Kumar et al., Appl. Phys. Lett., 63, (14), 2002–2004 (Oct. 1993).

Hidber et al., Langmuir, 12, 1375–1380 (1996).

* cited by examiner

Primary Examiner—Mathieu D. Vargot
(74) Attorney, Agent, or Firm—Scully, Scott, Murphy & Presser; Daniel P. Morris, Esq.

(57) ABSTRACT

A process of making a microcontact printing stamp useful in the microcontact printing of a microcircuit. In this process an elastomeric microcontact printing stamp is formed by curing a degassed liquid elastomeric monomer or oligomer, optionally saturated with helium, a mixture of helium and an inert gas or a mixture of hydrogen and an inert gas, in a mold in which a photoresist master, defining a microcircuit in negative relief, is predisposed above a backplane.

17 Claims, 3 Drawing Sheets

PROCESS OF FABRICATING A PRECISION MICROCONTACT PRINTING STAMP

BACKGROUND OF THE DISCLOSURE

1. Field of the Invention

The present invention is directed to a formation of a microcontact printing stamp employed in the creation of microcircuitry where dimensional integrity and registration must be maintained at the micron level over very large distances that may be as long as half a meter. More particularly, the present invention is directed to a process of preparing a high precision microcontact printing stamp in which printing stamp expansion is effected by gas exchange.

2. Background of the Prior Art

The process of microcontact printing, to create a very fine pitch pattern, is of recent vintage. This process is described in Kumar et al., *Appl. Phys. Lett.*, 63, (14), 2002–2004 (October 1993) and Hidber et al., *Langmuir*, 12, 1375–1380 (1996). This process, which can conceivably replace photolithography in the fabrication of electronic components, especially where extremely fine line dimensions are required, requires the creation of a very fine pitch rubber stamp.

The very fine pitch rubber stamp utilized in microcontact printing is most often formed of an elastomeric material which is usually silicone rubber. Those skilled in the art are aware the term "silicone rubber" denotes polydimethylsiloxane (PDMS). In the current method of preparing rubber stamps used in high precision microcontact printing liquid, PDMS is introduced into a mold where a negative relief microcircuit pattern is expressed. The polymer is thereupon cured to produce a solidified rubber stamp which is removed from the mold. The solidified rubber stamp has a microcircuit pattern expressed in positive relief. It is this pattern that is transferred to a substrate in subsequent steps in the microcontact printing process.

The positive relief pattern provided on the rubber stamp is thereupon inked onto a substrate. Although there are several variations of microprinting methodology, commonly, the substrate is blanket coated with a thin gold film. The gold coated substrate is inked with an alkane thiol material transferred thereto by the stamp. Oftentimes, the alkane thiol material has the structural formula $CH_3—(CH_2)_{18}—CHSH_2$. It should be appreciated that other alkane thiol materials, as well as other inks, can be substituted for this alkane thiol.

Upon contact of the positive release pattern of the stamp with the gold film, a monolayer of the ink, preferably an alkane thiol, having the desired microcircuit pattern, is transferred to the gold film layer. Alkane thiols form an ordered monolayer on gold by a self assembly process. Thus, a self assembled monolayer (SAM) of the desired pattern is formed on the gold layer. The SAM is tightly packed and well adhered to the gold. As such, the SAM acts as an etch resist upon contact of a gold etching solution onto the stamped gold film layer.

In the next step, the inked substrate is immersed in a gold etching solution and all but the SAM is etched away to underlying layers below the gold layer. The SAM, which is unaffected by the gold etch, is then stripped away leaving gold in the desired pattern.

The aforementioned description is set forth in the Kumar et al. technical article. The Hidber et al. technical article utilizes a different procedure wherein the aforementioned rubber stamp is inked with a palladium catalyst and a pattern is again stamped onto a substrate. The positive relief microcircuit pattern of the palladium catalyst is subsequently immersed in an electroless plating solution which induces the desired microcircuit pattern by electroless plating.

The aforementioned description makes it apparent that faithful reproduction of the microcircuit pattern of the printing stamp onto the substrate is critical, especially when the pattern is of both fine pitch and of very large overall dimension. For example, if microcontact printing is used to produce microcircuitry on flat panel displays, it may require 5 micron sized defined features to accurately register to one another within one micron across a linear distance of 15 inches.

In turn, faithful reproduction of the microcircuit onto the substrate requires the fabrication of a microcircuit printing stamp that faithfully reproduces the desired microcircuit. This challenge to produce a high precision microcircuit printing stamp is magnified by the additional requirement that this formation of a microcircuit printing stamp be simple and cost effective. This latter requirement is emphasized because a primary application of this technology is the manufacture of flat panel displays. Flat panel displays must be produced at low cost and yet must meet the stringent tolerance criteria mentioned above.

In the past microcontact printing could not meet this challenge. This was because microcontact printing stamps could not satisfy the registration requirement because of shrinkage during printing stamp preparation. That is, the elastomeric polymer would shrink in the mold during printing stamp preparation. As those skilled in the art are aware, when an elastomeric polymer, such as silicone rubber, cures in a mold it shrinks to a degree of between about 0.1% to about 4%.

Thus, it is apparent that there is a strong need in the art for a new microcircuit printing stamp forming process that provides a stamp that provides good registration by compensating for the shrinkage that occurs during curing in the mold.

BRIEF SUMMARY OF THE INVENTION

A new process has now been developed which results in the formation of a high precision microcontact printing stamp providing a positive relief microcircuit pattern faithful to the dimensional requirements of the desired microcircuit.

In accordance with the present invention a process of fabricating a high precision microcontact printing stamp is provided. In this process an elastomeric monomeric or oligomeric system, in which air, saturated therein, is removed, is introduced into a mold in which a photoresist master providing a microcircuit in negative relief, disposed on a substrate, is predisposed above a stamp backplane. The elastomeric monomer or oligomer is thereupon cured to produce a printing stamp which is faithful to the dimensional requirements of the desired microcircuit.

BRIEF DESCRIPTION OF THE DRAWINGS

The present invention may be better understood by reference to accompanying drawings of which.

DETAILED DESCRIPTION

Figure 1:
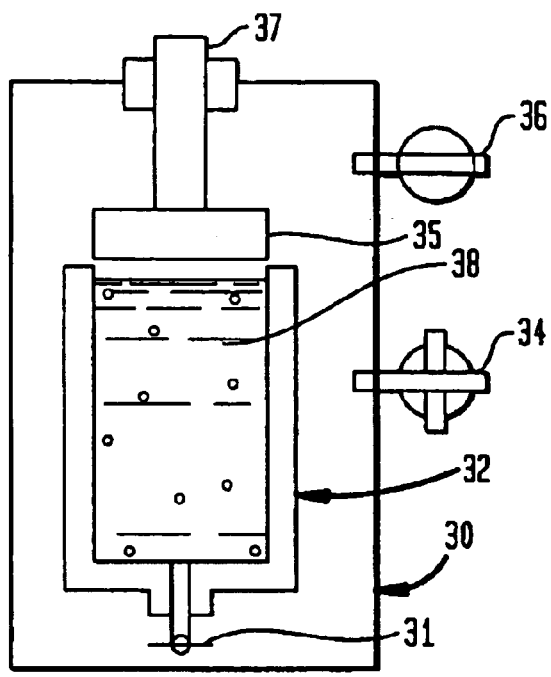
FIG. 1 is a schematic representation of a liquid elastomeric monomeric or oligomeric system disposed in a sealable unsealed container being degassed in a vacuum chamber.
Figure 2:
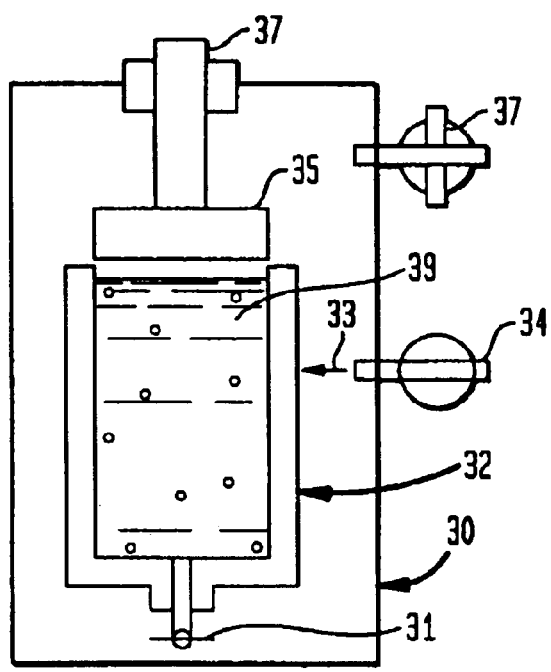
FIG. 2 is a schematic representation of saturating said liquid elastomer monomer with helium; helium and an inert gas or hydrogen and an inert gas.
Figure 3:
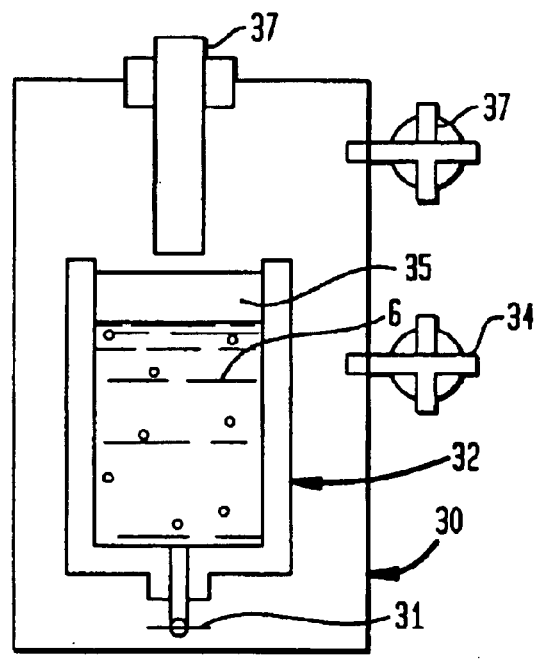
FIG. 3 is a schematic representation of sealing the sealable container filled with liquid elastomeric monomer or oligomer saturated with helium; helium and an inert gas or hydrogen and an inert gas.

A recently developed process of microcontact printing, often called "soft-lithography," requires the preparation of a very fine pitch pattern on the surface of a rubber printing stamp. It is to the preparation of such a stamp that the present invention is directed.

The process of preparing a very fine pitch pattern on the surface of a rubber stamp occurs in a molding operation. The molding operation occurs in a mold housing 1 in which a backplane 4 is disposed. Backplane 4 is any smooth material which is bendable during the printing operation but which provides some stability in length and width directions. Preferred backplane materials include metals, plastics and rubbers which meet these criteria. The backplane 4 is usually disposed on a temporary substrate preplaced in the mold housing 1.

In addition, a photoresist master assembly 10 includes a negative relief photoresist pattern 3 disposed on a substrate 2. The substrate 2 is any smooth and rigid material to which the photoresist can be applied and developed into a pattern. The photoresist pattern need be inert only to the monomer or oligomeric liquid precursor which is polymerized. This to prevent swelling of the photoresist pattern.

As indicated earlier, a problem in the prior art resides in the shrinkage of a liquid monomeric or oligomeric material used in manufacturing the elastomeric printing stamp. It should be understood that the term "liquid elastomeric material" encompasses catalyst, promoters and the like, as well as monomer or oligomer. The liquid elastomeric monomer or oligomer is introduced into mold 1 so that it fills the space between the photoresist master assembly 10 and the backplane 4. As indicated above, shrinkage of the elastomeric monomer or oligomer, when cured into the elastomeric polymer, is in the order of between about 0.1% to about 4%. Obviously, if a method could be found to reduce this degree of shrinkage, a satisfactory printing stamp could be produced.

Those skilled in the art are aware that liquids of all kinds become saturated with gases with which they are in contact. Thus, elastomeric monomeric or oligomeric materials, which are liquids, become saturated with gases with which they are in contact, usually air. Therefore, the elastomeric material becomes saturated with air, e.g. nitrogen and oxygen molecules. Thus, by reducing the volume of air saturated in the monomeric or oligomeric material to a degree equal to the shrinkage that occurs during curing, shrinkage, as existent in prior art processing, is eliminated. The present process provides a means of accomplishing this task.

Turning then to the invention of the present application, a container 32, which in one preferred embodiment is a syringe, is provided. An elastomeric monomeric or oligomeric material, as defined above, is disposed therein. The monomeric or oligomeric material 38 is preferably dimethylsiloxane but can be any other elastomeric monomeric or oligomeric material that produces an effective printing stamp. Among other monomers and oligomers that may be employed are those that cure to produce natural rubber, butadiene rubber, polyurethane rubber, polyepoxy rubber, acrylic rubber, polyphosphazine rubber and the like. As shown in FIG. 1, the dimethylsiloxane or other monomeric or oligomeric elastomer is shown saturated with gaseous air molecules which, of course, are mainly oxygen and nitrogen molecules. The thus filled container 32 is disposed in a vacuum chamber 30, which is a term used to denote a chamber in which pressures down to almost a pure vacuum can be tolerated. The vacuum chamber 30 is equipped with an exhaust system 36, attached to a vacuum pump (not shown), to exhaust gas originally present in the chamber 30, as well as gas that diffuses from the monomeric or oligomeric solution.

During the first step in the processing of the elastomeric monomer the chamber 30 is evacuated by opening valve 36 so that gas in chamber 30 is removed by the action of the vacuum pump. During this operation chamber 30 is completely closed to the atmosphere. It is noted, however, that a shaft 37, attached to a syringe plunger 35, is moveable without disturbing the closed nature of the chamber 30. This is accomplished by providing a vacuum feedthrough for shaft 37.

After the gas, e.g. air, saturated in the liquid elastomeric monomeric liquid 38 is removed, valve 37, which provides access to a vacuum pump, is closed, completing the degassing step. In one preferred embodiment wherein the greatest degree of shrinkage is avoided, curing, discussed below, immediately follows.

In a second preferred embodiment of the process of the present invention a second valve 34, which is closed during the degassing step, is opened to provide a supply of helium or hydrogen. This gas stream, denoted by arrow 33, flows into chamber 30 until the degassed monomer or oligomer, denoted by reference numeral 39, is "saturated." That is, the gas stream 33 continues until the gas concentration in the liquid monomer or oligomer 39 remains unchanged.

Hydrogen or helium represent the two gases whose molecules are the smallest. As such, their substitution for the much larger molecules of air represent a significant volume in shrinkage of the monomeric or oligomeric liquid mixture. Thus, the shrinkage of untreated elastomeric monomeric or oligomeric liquid when cured is reduced by the degree of shrinkage resulting from the substitution of hydrogen or helium molecules for air molecules in the saturated monomeric or oligomeric liquid.

Three classes of gas streams containing helium or hydrogen may be utilized in this process. The first of these gas steams is pure helium, the second, a mixture of helium and an inert gas and the third is a mixture of hydrogen and an inert gas. The inert gases used with helium or hydrogen is preferably nitrogen.

It is noted that hydrogen is not employed neat in order to avoid the explosive danger associated with the use of undiluted hydrogen. A mixture which includes a predominant concentration of an inert gas, such as nitrogen, significantly reduces this explosion danger.

It is further to be appreciated that there are advantages and disadvantages of neat use of helium and hydrogen compared to a mixture of either of these gases with an inert gas. The advantage of the neat use of helium or hydrogen is that the degree of monomeric or oligomeric shrinkage is magnified. The disadvantage of the neat use of helium or hydrogen is that the degree of monomeric or oligomeric shrinkage is magnified too greatly. The advantage of a mixture of helium or hydrogen with an inert gas, especially nitrogen, is that, because of the close resemblance to air molecules, the degree of shrinkage will not "overshoot the mark." That is, the degree of monomeric or oligomeric shrinkage will not exceed the degree of shrinkage associated with curing.

When the monomeric or oligomeric liquid 39 becomes saturated with the incoming gas stream 33, that gas stream is cut off by closing valve 34 and shaft 37 is downwardly slided so that plunger 35, which acts as a sealant, closes off the saturated liquid monomer or oligomer, now denoted by reference numeral 6, from atmospheric contamination.

Upon the sealing of container 32, which in a preferred embodiment is a syringe, filled with the elastomeric monomer or oligomer 6, container 32 is removed from vacuum chamber 30. As denoted in the drawings, container 32 is provided with a valve 31 for removal of the liquid content therein, the saturated liquid monomer or oligomer 6.

The saturated liquid monomer or oligomer filled container 32 is thereupon placed in fluid communication with a mold housing 1 which may be equipped with means to communicate with the means of egress, through valve 31, of the monomer or oligomer 6 in container 32. In this way the saturated elastomeric monomer or oligomer 6 is introduced into the mold 1 by pressing down on plunger 35, causing flow of monomer or oligomer 6 through open valve 31 into mold 1.

Figure 4:
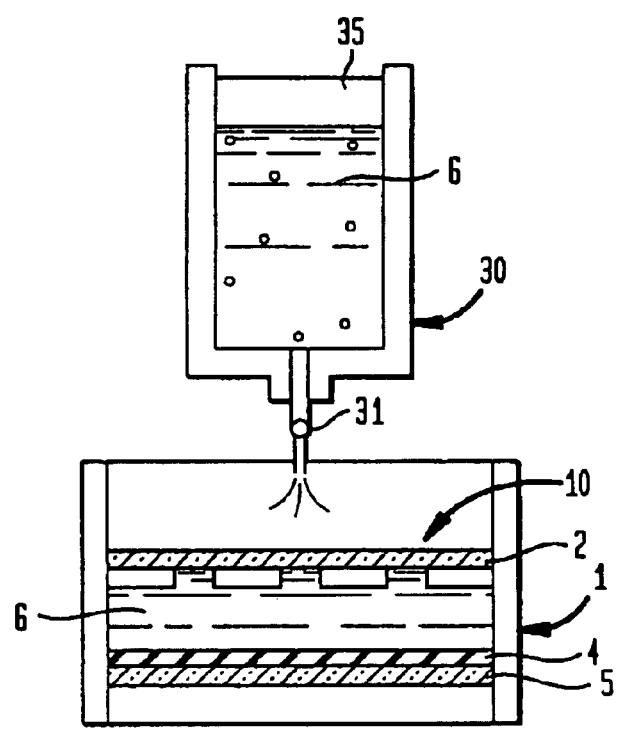
FIG. 4 is a schematic representation of introducing said degassed and optionally gas saturated liquid elastomeric monomer or oligomer into a mold.
Figure 5:
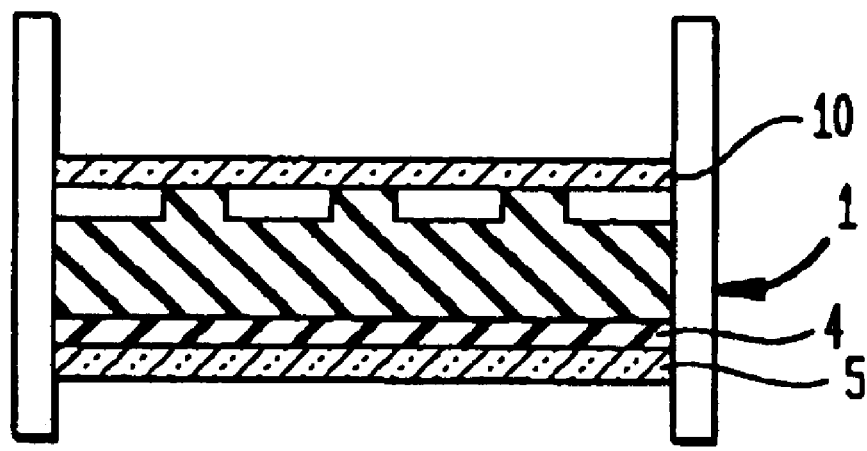
FIG. 5 is a schematic sectional representation of the cured elastomer in the mold.

As stated above, a backplane 4 is predisposed in mold 1. The backplane 4 may be attached to a temporary substrate 5, illustrated in FIG. 4 as a glass plane, to provide the backplane 4 with rigidity and flatness. In addition, a photoresist assembly 10, which comprises a flat and rigid substrate 2, preferably a glass plane, and a photoresist pattern in negative relief, is provided in mold 1 above backplane 4.

The elastomeric monomer or oligomer, either degassed or saturated with a gas comprising helium or hydrogen, is thereupon cured in mold 1. The curing step is conducted in accordance with standard methods used in the crosslink polymerization of thermosetting elastomeric monomers or oligomers. Typically, especially when the preferred elastomeric monomer is dimethylsiloxane or an oligomer thereof, curing preferably occurs at a temperature in the range of between about 40° C. and about 80° C. More preferably, curing occurs at a temperature of about 60° C. Of course, the curing temperature may differ when the monomer or oligomer is other than dimethylsiloxane.

Figure 6:
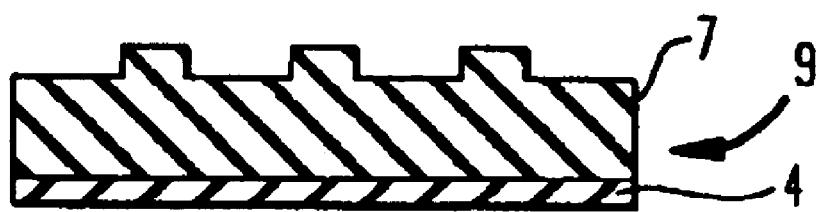
FIG. 6 is a schematic sectional view of the printing stamp of the present invention.

The monomeric material 6 is therein cured to form an elastomeric printing stamp 9 which, includes, at its top end, a photoresist pattern in positive relief provided by photoresist master pattern 3. The thus formed elastomeric polymer 7 is connected to a backplane 4, insofar as the temporary substrate 5 is removed. The thus formed printing stamp 9 is illustrated in FIG. 6. Because the degree of shrinkage that occurs in curing is reduced by the decrease in monomeric or oligomeric volume, as well as the expansion of the cured stamp product upon exposure to air, the shrinkage associated, in the prior art, with fabrication of elastomeric microcontact printing stamps is eliminated.

The above embodiments are provided to illustrate the scope and spirit of the present invention. These embodiments will make apparent, to those skilled in the art, other embodiments and examples. Those other embodiments and examples are within the contemplation of the present invention. Therefore, the present invention should be limited only by the appended claims.

What is claimed is:

1. A process of making a microcontact printing stamp comprising the steps of:
   (a) introducing a liquid elastomeric monomer or oligomer into a sealable container;
   (b) degassing said elastomeric monomer or oligomer;
   (c) sealing said sealable container holding said degassed liquid elastomeric monomer or oligomer;
   (d) introducing said degassed liquid elastomeric monomer or oligomer into a mold in which a photoresist master, defining a microcircuit in negative relief, is disposed above a backplane; and
   (e) curing said elastomeric liquid monomer or oligomer to form a cured elastomeric printing stamp.

2. A process in accordance with claim 1 wherein said step (b) comprises exposing said liquid elastomeric monomer to very low pressure.

3. A process in accordance with claim 1 comprising the steps, subsequent to said step (b), of exposing said degassed liquid elastomeric monomer or oligomer to a gaseous atmosphere selected from the group consisting of helium gas, a gaseous mixture of helium and nitrogen and a gaseous mixture of hydrogen and nitrogen whereby said liquid elastomeric monomer or oligomer becomes saturated with said gas in said gaseous atmosphere.

4. A process in accordance with claim 1 wherein said sealable container is a sealable syringe.

5. A process in accordance with claim 1 wherein said step (e) occurs at a temperature in the range of between about 40° C. and about 80° C.

6. A process in accordance with claim 1 wherein said degassed liquid elastomeric monomer or oligomer is saturated with a gas selected from the group consisting of helium, helium and another an inert gas and hydrogen and an inert gas prior to said curing step (e).

7. A process in accordance with claim 6 wherein said gas is helium.

8. A process in accordance with claim 6 wherein said gas is helium and another inert gas.

9. A process in accordance with claim 6 wherein said gas is hydrogen and an inert gas.

10. A process in accordance with claim 8 wherein said another inert gas is nitrogen.

11. A process in accordance with claim 9 wherein said inert gas is nitrogen.

12. A process in accordance with claim 1 wherein said elastomeric monomer or oligomer is dimethylsiloxane or an oligomer of dimethylsiloxane.

13. A process of making a microcontact printing stamp comprising the steps of:
   (a) introducing a liquid elastomeric monomer into an unsealed sealable container;
   (b) disposing said unsealed container in a vacuum chamber;
   (c) reducing the pressure in said chamber such that said liquid elastomeric monomer is degassed;
   (d) sealing said container;
   (e) bringing said container into fluid communication with a mold in which a photoresist master expressing a microcircuit in negative relief is predisposed above a stamp backplane;
   (f) unsealing said container and introducing said degassed liquid elastomeric monomer or oligomer;
   (g) curing said elastomeric monomer or oligomer whereby a cured elastomeric stamp is formed; and
   (h) removing said stamp having said microcircuit expressed in positive relief from said mold.

14. A process in accordance with claim 13 comprising the step, subsequent to said step (c), of saturating said degassed liquid with a gas selected from the group consisting of helium, a mixture of helium and nitrogen and a mixture of hydrogen and nitrogen.

15. A process in accordance with claim 13 wherein said sealable container is a syringe.

16. A process in accordance with claim 14 wherein said sealable container is a syringe.

17. A process in accordance with claim 16 wherein said gas saturating said degassed liquid monomer or oligomer is a mixture of helium and nitrogen.

* * * * *

UNITED STATES PATENT AND TRADEMARK OFFICE
CERTIFICATE OF CORRECTION

PATENT NO. : 6,881,366 B2
DATED : April 19, 2005
INVENTOR(S) : Peter Fryer et al.

It is certified that error appears in the above-identified patent and that said Letters Patent is hereby corrected as shown below:

Column 6,
Line 33, "and another an inert gas" should read -- and another inert gas --.

Signed and Sealed this

Fourth Day of October, 2005

JON W. DUDAS
*Director of the United States Patent and Trademark Office*